United States Patent
Sylvester

[11] Patent Number: 5,888,631
[45] Date of Patent: Mar. 30, 1999

[54] METHOD FOR MINIMIZING WARP IN THE PRODUCTION OF ELECTRONIC ASSEMBLIES

[75] Inventor: Mark F. Sylvester, Eau Claire, Wis.

[73] Assignee: W. L. Gore & Associates, Inc., Newark, Del.

[21] Appl. No.: 745,972

[22] Filed: Nov. 8, 1996

[51] Int. Cl.⁶ .................................................. B32B 3/00
[52] U.S. Cl. ........................ 428/212; 428/213; 428/209; 174/256
[58] Field of Search ................... 428/209, 901, 428/212, 213; 174/256

[56] References Cited

U.S. PATENT DOCUMENTS

| | | | |
|---|---|---|---|
| 3,953,566 | 4/1976 | Gore | 264/288 |
| 4,189,524 | 2/1980 | Lazzari | 428/213 |
| 4,201,616 | 5/1980 | Chellis et al. | 428/901 |
| 4,482,516 | 11/1984 | Bowman et al. | 264/127 |
| 4,680,220 | 7/1987 | Johnson | 428/421 |
| 4,705,762 | 11/1987 | Ota et al. | 501/87 |
| 4,755,911 | 7/1988 | Suzuki | 428/901 |
| 4,888,247 | 12/1989 | Zweben et al. | 428/131 |
| 4,935,291 | 6/1990 | Gunnink | 428/213 |
| 4,985,296 | 1/1991 | Mortimer, Jr. | 428/220 |
| 5,100,740 | 3/1992 | Neugebauer et al. | 428/622 |
| 5,162,977 | 11/1992 | Paurus et al. | 428/209 |
| 5,352,762 | 10/1994 | Nagai et al. | 428/901 |
| 5,458,955 | 10/1995 | Vaughn et al. | 428/212 |
| 5,473,119 | 12/1995 | Rosenmayer et al. | 174/255 |
| 5,545,473 | 8/1996 | Ameen et al. | 428/283 |
| 5,571,608 | 11/1996 | Swamy | 428/209 |

FOREIGN PATENT DOCUMENTS

| | | |
|---|---|---|
| 05075263 | 3/1993 | Japan . |
| 05110257 | 4/1993 | Japan . |
| 06053684 | 2/1994 | Japan . |

Primary Examiner—William Krynski
Assistant Examiner—Cathy F. Lam
Attorney, Agent, or Firm—Victor M. Genco, Jr.

[57] ABSTRACT

The present invention relates to assembly techniques and the resulting products which are thermally stable, have high structural integrity, and compensate for thermal stresses that occur between the various components of the package. This is accomplished, in-part, by designing the package so that the coefficient of thermal expansion (CTE) of a stiffening ring which is mounted on the package substrate matches the CTE of the substrate and optional lid. Further, the particular adhesives used to bond the stiffening ring are chosen to match their CTE to that of the substrate, ring and lid. Moreover, the substrate is designed so that its CTE, at least in-part, matches that of the chip, and also that of the stiffening ring.

4 Claims, 10 Drawing Sheets

METHOD FOR MINIMIZING WARP IN THE PRODUCTION OF ELECTRONIC ASSEMBLIES

FIELD OF THE INVENTION

The present invention relates generally to the field of microelectronic fabrication and assembly and, more specifically, to methods and devices which reduce or eliminate bending moments and reduce stresses in an integrated circuit chip/package system which result from mismatched coefficients of thermal expansion (CTE) for the various system components and/or from adhesive curing during assembly. More specifically, the present invention relates to assembly techniques for stabilizing and forming semiconductor chips/package systems, by matching the CTEs of the various components, by providing differential CTE control within the components, and/or by offsetting CTE-induced bending moments with nulling bending moments.

BACKGROUND OF THE INVENTION

The electronic microcircuit, or "chip," in which a large number of electrical circuit components are diffused, for example, onto the surface of a 1 to 4 $cm^2$ chip of silicon or germanium, has become an integral and indispensable part of our industrial technology. The industrial significance of this technology is so great that continuous efforts are being made to improve chip performance, reliability and service life.

The delicate structure and very small size of these chips, however, have created unusually novel and difficult technical problems. These problems, generally caused by physical phenomena that are well known on a macroscopic scale, e.g., coefficients of thermal expansion (CTE), heat dissipation, adhesive shrinkage, flexural moduli, and the like nevertheless create entirely new and often undesirable sets of effects when they manifest themselves in the microscopic domain of the electronic chip.

Illustratively, a typical chip is mounted on and is electrically coupled to a supporting substrate. The substrate, in turn, is secured to a printed circuit board. Thus, the substrate not only serves the intermediate function of coupling electrical signals taken from conductors on the printed circuit board to the chip for processing, but also takes output signals from the chip and applies these output signals to other printed circuit board conductors for further processing.

Because a chip, when energized, generates a considerable amount of heat, which can be on the order of 50 to 100 watts emanating from a chip with an area of 1 to 4 $cm^2$, the CTE for the chip and that of its substrate can produce a number of very damaging effects. Controlling this heat, generated in so concentrated an area, in a manner that avoids chip failure through overheating is a problem that has not yet been solved in a fully satisfactory way.

For instance, one source of thermally related chip failure resides in the fact that the electrical characteristics of the circuit components that are diffused or otherwise impressed on the chip can vary markedly with changes in chip dimensions. These chip dimension changes caused, for example, by thermal expansion of the chip can make the expanded chip produce useless and, perhaps, damaging output signals. These undesired thermal expansion effects can also cause the central portion of a chip, secured at its margins to a substrate, to curve, bend or bow. This curving frequently causes at least some of the electrical connections between the chip and its underlying substrate to separate and disconnect from each other. Largely for these reasons, chip performance is degraded.

Unquestionably, this destruction of circuit continuity through a thermal expansion induced electrical connection failure is a CTE consequence that must be at least minimized if it can not be fully avoided.

Other destructive effects that are attributable to thermally induced curving include chip cracking and breaking. In this circumstance, chips crack and break in large measure because tensile stresses are established in the outermost surface of the chips as the chips are bent. These stresses, should they exceed the fracture strength of the chip, will cause the chip to crack or break. Thermal effects are not limited to the chip, but also appear in the substrate and in other chip packaging materials.

A substrate is a structure that is assembled by stacking together two to fifteen or more layers of substrate materials, at least two of these layers being of different compositions. The materials from which each of these layers are formed tend to be quite diverse, some layers, for instance, being metal (e.g., copper, nickel or gold), other illustrative layers being an epoxy resin and glass compound. The CTE for these individual layers, each being considerably different, invite an uncontrolled bending or thermally induced substrate surface distortion that is applied not only to the chip during circuit operation, but also to the substrate through the high temperatures that are required in substrate manufacture.

Preferably, the substrate surfaces that support the chip and establish electrical contact between the chip and the printed circuit board should be "flat" in all conditions of operation. Indeed, if the substrate itself is not sufficiently "flat", it will prove impossible to establish electrical contact between the chip and substrate.

There are, moreover, other ways in which the desired degree of substrate flatness can be destroyed, apart from CTE-related effects. One of these non-CTE related losses in flatness is found in the inability to control completely individual layer thickness in the layer manufacturing process. These individual layer thickness variations depart from standard or preferred thicknesses not only among different production lots, but also in different portions or areas of the same layer. These variations in individual layer thickness can contribute to localized variations in the coefficient of thermal expansion (CTE) within a substrate, which may contribute to warping of the substrate.

To establish some standard for judging flatness in these microscopic circumstances, and thus to distinguish acceptable variations in flatness from those that are industrially not acceptable, several criteria have been established. First, "flatness" for the purpose of chip mounting and packaging has been defined as the ratio of the maximum high to low deviation per unit area and has developed into an industry practice in which the maximum acceptable deviation from flatness is 2.5 μm. Further, there are other industrially accepted standards for warpage, or loss in flatness for an entire chip package and the chip package components, in which warpage of more than 6 to 8 mils over the entire chip package is industrially unacceptable. This is a goal that is difficult to achieve, but it is a goal nevertheless, that the chip packaging industry must meet, in spite of the fact that thickness deviations in a given substrate layer can be as much as ±15%.

In an attempt to solve or at least to cope with these curvature or bending problems, the chip packaging industry has moved in two entirely opposite directions. Ceramic substrates of about 40 mils or greater in thickness have been used. These thick substrates are so massive, relative to the supported chip, that chip bending does not occur.

The other, opposite, industrial approach has been to use substrates that are essentially thin films, e.g., about 2 mils or less in thickness. These thin substrate films deform and absorb almost all of the compressive stresses, surface irregularities and the like, thus leaving the chip in an essentially flat, undeformed condition, similar to the way in which "blister" or "shrink-wrap" packaging conforms itself to the shape of the packaged item.

In passing, it also should be noted that there are sources of chip warpage other than those described above. One illustrative non-thermally or production related source of warpage is a consequence of the adhesive underfill that is applied between opposing surfaces of the chip and the corresponding substrate area to secure the chip to the substrate and to stabilize the electrical connections between the chip and its substrate. The electrical connections in this substrate area directly under the chip, often referred to as the die area, usually are soldered joints. In this respect, the solder on these joints, over time, is subject to a deterioration that weakens and destroys the electrical connections within the die area. This deterioration in the soldered joints has a number of sources, one of these sources being a fatigue that is induced through relative movement between the chip and its substrate. Although filling the volume within the die area between the soldered joints with an adhesive (usually an epoxy resin cement) bonds the chip to the substrate and reduces relative movement as a source of the soldered joint deterioration, the adhesive does produce some undesirable side effects. For instance, on curing or hardening, the adhesive becomes a further locus of undesirable structural stress. The cured adhesive shrinks, placing the soldered joints in compression and through these compressive forces thereby applies still another curving movement to the chip and the substrate.

Clearly, these techniques for coping, with greater or lesser success, with curving or bending moments, whatever their source, in massive substrates of about 40 mils or more in thickness or in thin film substrates of about 2 mils or less nevertheless fail to suggest any solution for corresponding problems among intermediate range substrates with thicknesses greater than 2 mils and thinner than 40 mils.

Substrates in this intermediate range are too thin to force the chip to maintain a suitable degree of flatness. These intermediate range substrates are also too thick to absorb all of the bending moments, whatever the source, to enable the relatively thicker chip to structurally dominate the combination and maintain an all-important chip flatness. It has been found, in fact, that substrates in this intermediate range are excellent vehicles for transmitting bending stresses to their respective chips, thereby aggravating the chip bending stress difficulties summarized above. Nevertheless, in spite of these structural limitations, there is a significant commercial demand for chip substrates in this intermediate thickness range.

To complete a chip package, the chip usually is mounted in the center of the substrate. A ring to stiffen the chip and substrate combination often is bonded or secured to the substrate by means of an adhesive that is applied to the margin of the substrate, essentially enclosing the chip within the ring's center either before or after mounting the chip. The ring forms a frame around the chip with the inner perimeter of the ring being spaced from the corresponding edges of the chip and the height of the ring being somewhat greater than that of the chip. In this way, a lid, or cover, joined to that surface of the ring opposite to the ring surface that is bonded to the substrate, is spaced above the corresponding die area of the chip, leaving a gap between the upper surface of the chip and the opposing, die area surface of the lid that later is filled with a thermally conducting material.

The CTE, adhesive shrinkage, flatness irregularities and other sources of warping, bending and distortion considered above apply with essentially equal force to the ring and to the lid. Accordingly, to produce a marketable chip package these undesirable stress and bending effects, particularly for chips that have substrates with thicknesses greater than 2 mils and thinner than 40 mils, and more particularly between 5 mils and 25 mils, should be avoided, or at least controlled and reduced in order to maintain chip and chip component flatness within the acceptable degree of flatness that is defined in relevant industrial practice and standards.

SUMMARY OF THE INVENTION

The present invention relates to assembly techniques and the resulting products which are thermally stable, have high structural integrity, and compensate for thermal stresses that occur between the various components of the package. This is accomplished, in-part, by designing the package so that the coefficient of thermal expansion (CTE) of a stiffening ring which is mounted on the package substrate matches the CTE of the substrate and optional lid. Further, the particular adhesives used to bond the stiffening ring are chosen to match their CTE to that of the substrate, ring and lid. Moreover, the substrate is designed so that its CTE, at least in-part, matches that of the chip, and also that of the stiffening ring.

I ADHESIVE ENCAPSULATION

For example, chip package bending can be significantly reduced by forming one or more slots or holes in the lid. This slot, or slots, establish fluid communication with the void space surrounding the chip that is formed in the die area between the chip, the substrate, the lid and the margin between the edges of the chip and the inner walls of the ring. An adhesive is injected through the hole into this void space. In this way, the chip is potted, or encapsulated, in the adhesive simultaneously with being underfilled. Bonding the chip to the entire support structure effectively integrates the structure of the chip into the more massive substrate, ring and lid combination. Thus, in a large measure, the bonded chip is protected from bending under any one or more of the thermal and mechanical influences noted above.

Similarly, either independently of or in conjunction with the slot in the lid, one or more slots or holes also can be formed in the substrate, the ring, or both, also to communicate with the void space that surrounds the chip. An adhesive introduced through a hole in the substrate or the ring alleviates the chip bending problem in the same manner as the adhesive admitted through the slot in the lid. It has been found preferable, however, to flow the adhesive into the void space only from one or two slots. Flowing the adhesive into the void space from more than two slots can produce bubbles in the adhesive, particularly under the chip, a most undesirable result.

II SELECTIVELY STACKED SUBSTRATE LAYERS

Turning now to the substrate, it has been mentioned that a substrate can be formed by stacking from two to fifteen or more layers, at least two of these layers each being of different materials. In this respect, the dominant layers affecting warping occur at the outer surfaces of the substrate. Through a salient feature of the invention, however, it has been found that by using in the outer layers those materials over which the thickness and flatness can be most carefully controlled, e.g., a layer of copper, and adding, successively inward toward the center those layers that exhibit progressively greater production tolerance, warping effects can be markedly reduced, e.g., the warpage in one instance has been reduced, through the practice of this feature of the invention from about 400 µm to under 150 µm.

By stacking the substrate layers in this manner, the overall warping of the substrate is avoided to provide a substrate from which the undesirable bending phenomenon has been generally eliminated, at least within the range of temperatures that are ordinarily encountered in chip operation.

This principle of the invention, moreover, has application not only to the substrate, but also can be applied to the ring and lid structures, as appropriate.

III UNIT AREA COMPOSITION CONTROL

Recall that control of individual layer thickness can vary as much as ±15% from the desired thickness. These thickness irregularities create further bending in the substrate, or other chip package components as described above. In addition, the various layers may contain differing compositions at different points in the layer. This might occur as a result of patterning of a metal layer to form discrete conductive pathways. A chip package, manufactured in accordance with a process that further characterizes the invention, however, will provide valuable reductions in bending stress. In accordance with this feature of the invention, chip package components (of which the substrate is illustrative) are divided into small unit areas. The unit area composition in each layer progressively toward the outer surface of the component is analyzed to determine if all of the portions of the layers that are equal in distance from the plane of symmetry in the substrate under each unit area contain essentially equal amounts of the same materials. Respective layers are adjusted and controlled to produce a chip package component in which quantities of the same materials that are in each opposing layer within a unit area are approximately equal in amount, thereby providing a structure that has a generally low warpage throughout.

IV DIE AREA CTE CONTROL

Through careful analysis of CTE mechanisms in the microcosm of chip package technology, and in accordance with another feature of the invention, it has been found from the standpoint of maintaining chip flatness through the range of expected operating temperatures, that the CTE of the substrate immediately under the die is very important. If there is a CTE mismatch within the die area of the substrate and the overlaying chip, undesirable and potentially destructive bending or electrical contact shearing stresses will be applied to the chip and chip-substrate electrical connections. A salient feature of the invention, however, overcomes this difficulty by approximating the CTE of the substrate die area to that of the chip, while matching the average CTE of the chip package, and more particularly, the average CTE of the substrate, to the CTE of the circuit board to which the packaged microchip is attached.

This feature of the invention reduces relative differences in CTE between the substrate and the chip, thereby avoiding the differential in thermal expansion that produces bending stresses in the chip, solder joint shearing and fatigue. Thus, the chip and the die areas of the substrate, both enjoying generally the same CTE, expand and contract together as the temperatures change. By expanding and contracting together, relative movement between chip and die area of the substrate that in the prior art forced the chip to curve or to bend and applied shearing forces to solder joints is eliminated. Further, by matching the average CTE of the substrate and the associated chip package to the CTE of the printed circuit board, relative movement and the concomitant bending stresses and shearing forces between the chip package and the printed circuit board are also reduced.

V SELECTIVE CTE ADJUSTMENT

To further cope with bending stresses of thermal origin, the invention also provides for an unusual technique that selectively adjusts the CTE of one layer of material to approximate that of another layer. A structure of this character has two or more grooves, recesses, or holes, of any predetermined and desired shape, formed in a matrix layer. These holes, or loci, are filled with another material that has a CTE which is significantly different from the matrix layer CTE. On heating, the material in the holes expands at a rate and extent that is unlike the surrounding matrix in which the loci are formed. Although this differential expansion creates matrix layer stresses, at least in the vicinity of each of the loci, the aggregate effect of the expanded hole filler material, pressing against the surrounding portions of the matrix, increases the actual CTE of the matrix layer. Through an appropriate selection of the number and arrangement of the loci formed in the matrix and choice in filler material (or materials), within limits, the matrix layer or portions of that layer can be adjusted to produce a predetermined CTE.

The opposite result also can be achieved through the practice of the invention by fitting the matrix holes with an appropriate substance that adheres to the surfaces of the holes. Thus, on application of a temperature appropriate to a degree in which the matrix hole filling substance shrinks (in comparison with the matrix) the force applied by the substance to the matrix contracts the matrix to a greater degree than that of a matrix that has not been treated in accordance with the invention. Consequently, the matrix that is so treated takes on CTE shrinkage characteristics that can differ markedly from the CTE of the basic matrix material.

Applying this feature of the invention to the chip package, the substrate layers can be provided with a selected number and distribution of holes in the die area. These holes, filled with materials that have different CTE's than the surrounding matrix, approximate the aggregate CTE of the die area matrix in order to approach the CTE of the overlaying chip. Toward the periphery of the matrix, and under the ring, however, a different combination of matrix holes and filler materials are chosen to enable the aggregate CTE for this portion of the matrix layer to approach the CTE of the overlaying ring. Through proper selection of the number of holes, their distribution in the layers and the filler material for these holes it is now possible through the practice of the invention to adjust the matrix CTE, and thereby generally relieve both chip bending and bending stresses.

VI CHIP PACKAGE LID CTE ADJUSTMENT

It will be recalled, moreover, that the chip is a very concentrated source of heat, a heat that must be dissipated if the chip is to continue to function properly or, in extreme situations, to function at all. A thermally conductive interface can be applied to the die area between the chip and the overlaying lid to conduct heat from the chip to the die area of the lid in order to spread heat generated in the chip over a large portion of the surface area of the lid. A typical interface suitable for use with the invention is described in J. G. Ameen et al. U.S. Pat. No. 5,545,473 granted Aug. 13, 1996 and titled "Thermally Conductive Interface."

In those situations in which the chip is to be bonded to the die area of the lid, once more the stresses and bending effects imposed by differences between the chip CTE and the lid CTE become important. Ordinarily, chip package lids are formed from copper or aluminum. Alternatively, a combination of aluminum and silicon carbide or copper and silicon carbide or other low CTE reinforcement could be used. In accordance with another salient characteristic of the invention, it has been noted, for example, that aluminum has a CTE of 23 PPM/°C. Consequently, by manipulating the ratio of aluminum to silicon carbide in different portions of the lid, any predetermined CTE in a spectrum that extends from 23 PPM/°C. for pure aluminum to 3.7 PPM/°C. for pure silicon carbide can be prepared.

With this knowledge, a high silicon carbide and low aluminum concentration composition can be established in the die area for the lid in order to match the CTE of the chip that is bonded to the adjoining portion of the lid. The marginal portions of the lid that are bonded to the ring, however, are of a different aluminum/silicon carbide proportions. In this instance, the relative concentrations of aluminum and silicon carbide in the marginal portions of the lid are selected such that the average CTE of the lid matches the average CTE of the substrate/die combination. Through this technique, relative movement between the chip and the die area of the lid, the ring and the portion of the lid that is bonded to the ring and consequent bending as a function of thermal expansion is avoided, enabling each of the chip package components to remain essentially flat, while lowering stress on the die or adhesive interface.

The desired concentrations of aluminum and silicon carbide (to name just two of the possible materials) can be prepared in several ways. One of these techniques that also characterizes the invention provides a porous shape with the same dimensions as the outside dimensions of the ring. The shape has a thickened central core of porous silicon carbide with dimensions about equal to the die area. One or more peripheral recesses at the margin of the shape establish a concentration of silicon carbide which matches, in part, the CTE of the ring. Molten aluminum is essentially dissolved in the porous silicon carbide matrix, the relative proportions of aluminum and silicon carbide varying over the span of the shape to match the respective CTE of each of the underlaying components. In this way, the lid's peripheral CTE approximates a predetermined value (e.g., the CTE of the ring). Thus, through the practice of this feature of the invention, a lid is provided with very diverse thermal expansion characteristics, these characteristics matching the CTE of the lid die area to that of the chip and the peripheral CTE of the lid to that of the ring.

VII CTE CANCELLATION

An additional feature of the invention counterbalances, or cancels, the bending moments that otherwise would be applied by the substrate to the chip, thereby eliminating relative movement between the substrate and the chip and thus avoiding the associated bending of the chip that this relative movement would cause. In this characteristic embodiment of the invention, electrically inactive components or passive electrical components (e.g., capacitors, resistors and inductors) that have the same CTE or a CTE that is similar to that of the active chip are coupled to the exposed die area surface of the substrate on the side of the substrate that is opposite to the side to which the electrically active chip is coupled. Because the electrically active chip and the electrically passive or inactive elements both enjoy essentially the same CTE, the thermal expansions of both chips are about equal. Relative movements of these chips with respect to the substrate, although equal, are on opposite sides of the substrate, thereby effectively cancelling any chip-related bending moments that otherwise would occur. In this situation, the electrically active chip remains suitably flat.

A further embodiment of this feature of the invention provides for the insertion of a stiffener in the die area of the substrate to prevent that portion of the substrate from bending relative to the chip mounted directly over that portion of the substrate, through the range of device operating temperatures. So mounted, the stiffener generally overcomes the undesirable substrate warping in the chip die area.

Thus, in accordance with the principles of the invention, there is provided method and apparatus for overcoming the potentially destructive effects of relative movements among chip package components. The scope of the invention is limited, however, only through the claims appended hereto.

I Adhesive Encapsulation

Figure 1:
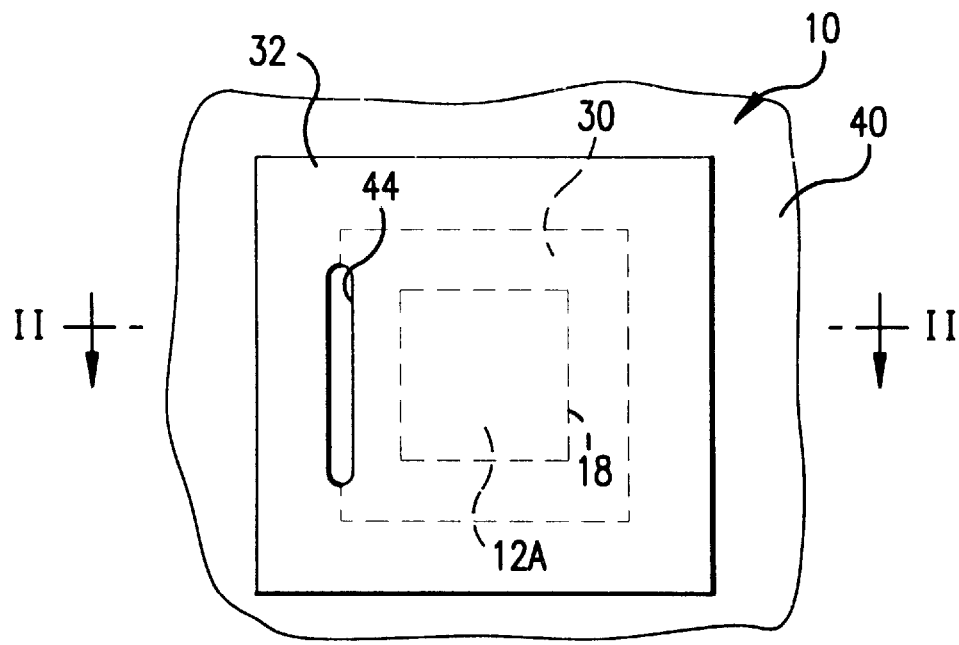
FIG. 1 is a plan view of a chip/package system embodying principles of the invention.
Figure 2:
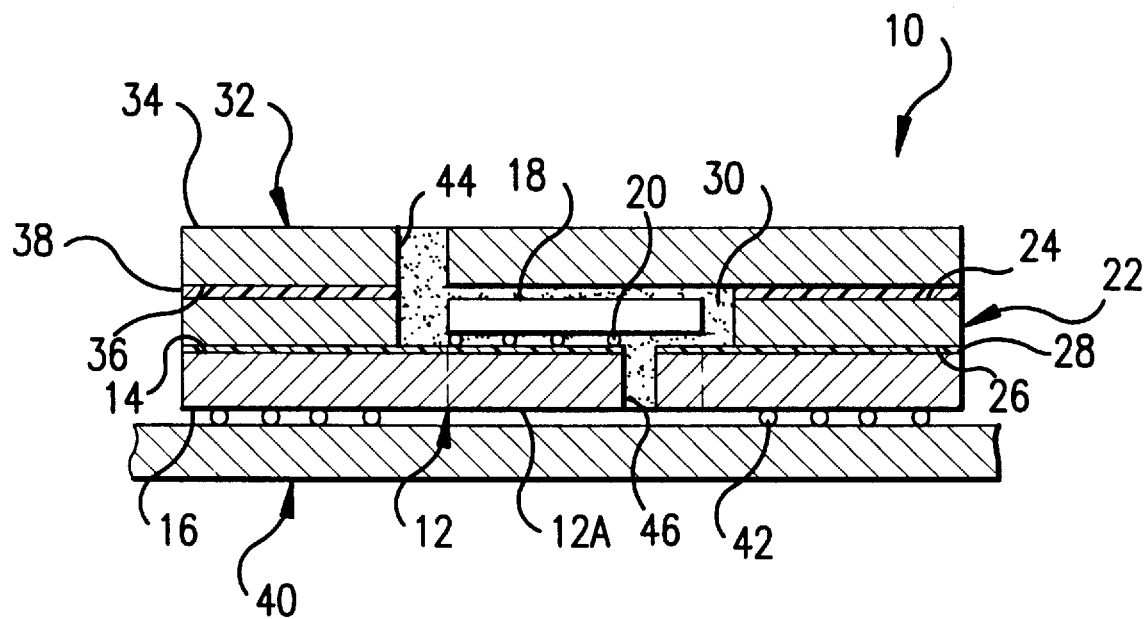
FIG. 2 is a sectional view of the chip/package system of FIG. 1, taken along line II—II of FIG. 1.

For a more complete understanding of the invention, attention is directed to FIGS. 1 and 2, in which a chip/ package system 10 includes a package 12 having first and second opposite planar surfaces 14 and 16. An integrated circuit chip 18 is connectable through solder bumps or balls 20 to the surface 14 of the package 12. The solder balls 20 establish both a mechanical and electrical connection of the package 12 to the chip 18.

A constraining ring 22 having opposite surfaces 24 and 26 is bonded to the package 12 through an adhesive layer 28. The constraining ring has a centrally located rectangular opening which defines a chip-mounting cavity 30. Generally, the constraining ring 22 stiffens the package 12 to permit easier handling of the package prior to and after chip attachment and to reduce thermally-induced bending moments which result when the coefficient of thermal expansion (CTE) of the package 12 is mis-matched with that of the chip 18. The thickness of the constraining ring 22 is slightly greater than the corresponding dimension of the chip 18.

A lid 32 having opposite surfaces 34 and 36 is bonded to the constraining ring 22 through an adhesive layer 38. The inner surface 38 of the lid 32 is spaced from the upper surface of the chip 18. The outer peripheral edges of the lid 32, constraining ring 22, and package 12 are co-existent and form a square. In a particular embodiment, the square measures 33 mm on each side. It is not necessary, however, for the package to be square shaped, although the square configuration is used frequently. Also, the 33 mm size is one embodiment, but other sizes can be used.

When installed in an electronic device, the chip/package system 10 is mounted on a printed wiring board (PWB) 40 through solder balls 42. As with the solder balls 20, the solder balls 42 provide electrical and mechanical connection between the package 12 and the PWB 40.

Preferably, both the package 12 and the PWB 40 are made of multilayered laminations of alternatingly disposed dielectric and conductive layers. The preferred dielectric materials, which are organic, as well as the preferred conductive materials, will be discussed in greater detail below.

A problem in chip/package assembly arises when an adhesive underfill is applied between the lower surface of the chip 18 and the upper surface 14 of the package 12 to reinforce the mechanical connection between the package 12 and the chip 18. As the adhesive cures and shrinks, there is a tendency for the package 12 to warp, and since the chip 18 is connected to the package 12, a bending moment can be applied to the chip 18. This bending moment, if severe enough, can fracture the chip, disrupt circuits and components diffused in the chip, and/or compromise the solder ball connections between chip and the package.

One aspect of the present invention is to provide a counter or offsetting bending moment by filling the chip mounting cavity 30 with an adhesive which mechanically couples the lid 32 to the upper surface of the chip 18. The adhesive is introduced into the chip mounting cavity 30 after the lid 32 has been bonded in place on the constraining ring 22.

The adhesive is applied in a liquid state through an opening 44, which is preferably an elongated slot formed parallel to one of the four sides of the chip/package system 10. As an example of an application technique, the liquid adhesive can be applied through a needle extending into the opening 44. The tip of the needle is juxtaposed the solder ball region and the underfill adhesive is released from the tip while advancing the tip along the slotted opening 44. The adhesive migrates by capillary action to cover the area between the lower surface of the chip 18 and the upper surface of the package 12.

After the underfill adhesive is applied, the tip of the applicator or needle can be juxtaposed within the space between the lower surface 38 of the lid 32 and the upper surface of the chip 18, and as the needle is again advanced along the slotted opening, capillary action draws the adhesive into this space.

The entire chip mounting cavity can be filled with the adhesive, as shown in FIG. 2, or simply the spaces between the chip 18 and surfaces of the lid 32 and package 12. As an alternative to the opening 44, or in addition thereto, an opening 46 may be formed in the package 22. If the entire cavity 30 is to be filled, there is no requirement for either opening 44 or 46 to be aligned with any one of the outer edges of the chip 18.

Opening 46 would likely be a hole, and not a slot. Moreover, two openings are generally preferred when filling the cavity with adhesive to allow air to escape during adhesive filling. The two holes can both be formed in the lid, or one can be formed in the lid and the other in the package, as depicted in FIG. 2.

Since the adhesive in contact with bond surfaces of the chip is curing simultaneously, and since the adhesive couples the chip 18 to structures on opposite sides thereof, bending moments imparted by adhesive shrinkage and CTE mismatch on one side of the chip are offset by bending moments imparted by heat shrinkage and CTE mismatch on the other side.

In conjunction with the offsetting or nulling bending moments, the package 12 and lid 32 are made of materials selected to approximately match the CTE of the two components so that the opposing bending moments are equal, but opposite.

The adhesive that is introduced into the cavity 30 is preferably thermally conductive to ensure that heat generated by the chip 18 passes from the cavity 30 to lid 32, which is likewise preferably made of a thermally conductive material.

The adhesive layers 28 and 38 can be made of any suitable adhesive material, such as, but not limited to epoxy adhesives, porous substrates impregnated with adhesives that are moisture resistant and are able to withstand temperatures in excess of 150° C., porous substrates that are impregnated with an adhesive-filler mixture that are moisture resistant and able to withstand temperatures in excess of 150° C., preferably in excess of 200° C., porous substrates that are impregnated with an adhesive-conductive particle mixture that is moisture resistant and able to withstand temperatures in excess of 150° C., preferably in excess of 200° C., e.g., Ablestik®. The adhesive layers 28 and 38 may be made of the same material or different materials. Several are commercially available, including the Ablestick ECF564 and ECF564A conductive epoxies, and GoreBond M6. The overfill and underfill adhesives can be a liquid epoxy containing $SiO_2$, e.g., Hysol 4526O. The overfill adhesives can also be solders or other metallurgical bonding agents. Other suitable materials for use as adhesive materials are described below.

The adhesive materials used for adhesive layers 28 and 38 are preferably in sheet form, while the adhesive filled in the cavity 30 is preferably in liquid form. However, the sheet adhesive layers could be replaced with liquid materials, and the liquid materials in the cavity 30 could be replaced with sheet materials, at least with respect to the area between the chip 18 and lid 32.

II Selectively Stacked Substrate Layers

Figure 3:
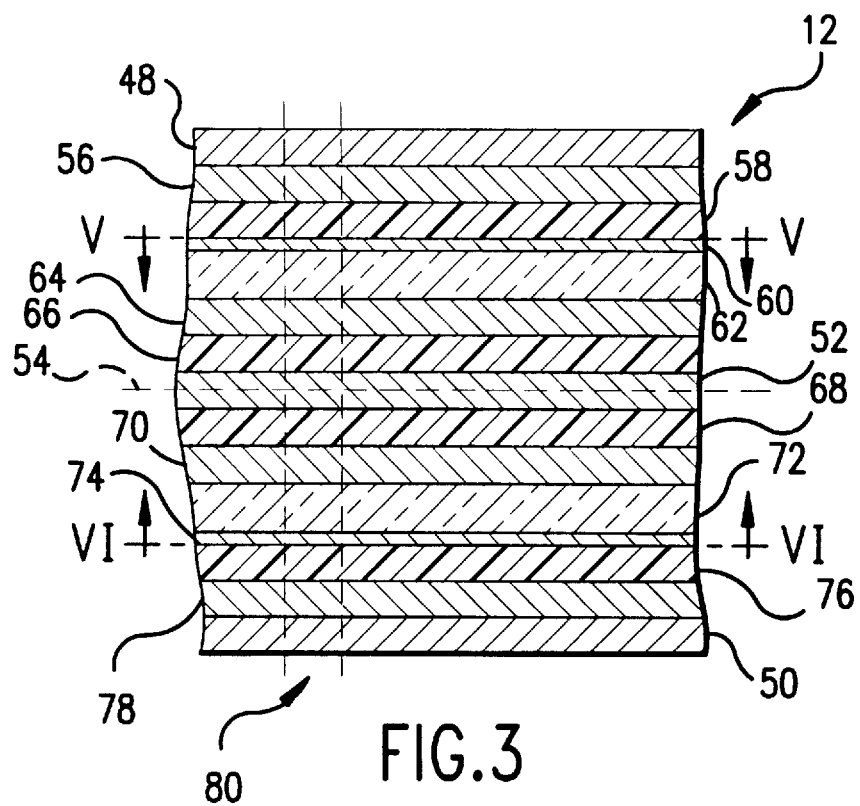
FIG. 3 is a vertical sectional view of the package component of the chip/package system of FIG. 1.

FIG. 3 is a vertical sectional view of a laminated structure for the package 12, which may be used in the chip/package system of FIG. 1. In accordance with a feature of the invention, it has been found that by using in the outer layers 56 and 78, illustratively, each layer being about a 20 μm thick layer of metal, those materials that have the least departure from the manufacturer's thickness tolerance (usually the metal layers) and by progressively adding from the outer layers 48 and 50 toward the center or core layer 52 (e.g., copper, 35 μm thick) those materials in which manufacturing thickness tolerances become progressively greater (usually the dielectric layers), the overall substrate is balanced from a thermal expansion standpoint.

The balance is such, moreover, that the curving, and its destructive effect on the chip (not shown in FIG. 3), or the ability to establish electrical contact with the chips is largely overcome.

A combination of layers, to form a suitable substrate that does not exhibit significant thermal bending within the normal range of chip operation, as shown in FIG. 3, would comprise, in order from the soldermask layer 48, inwardly toward the conductive copper center of core layer 52 through which a plane of symmetry passes:

a) 20 μm Cu/Ni/Au layer 56, a conductor;
b) 44 μm cyanate ester-epoxy-ePTFE (CE/E-ePTFE) layer 58, a dielectric;
c) 9 μm Cu layer 60, a conductor;
d) 50 μm bismalimide-triazine (BT)-Epoxy/Glass layer 62, a dielectric;
e) 18 μm Cu layer 64, a conductor; and
f) 44 μm CE/E-ePTFE layer 66, a dielectric.

For example, the CE/E-epoxy-ePTFE layer 58 is prepared as follows: a varnish solution is made by mixing 5.95 pounds of M-30 (Ciba Geigy), 4.07 pounds of RSL 1462 (Shell Resins, Inc.), 4.57 pounds of 2, 4, 6-tribromophenyl-terminated tetrabromobisphenol A carbonate oligomer (BC-58) (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths—20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web, such as that shown in FIG. 11, may be any desired thickness, such as 25 μm, 40 μm, for example. A 25 μm thick material has a weight per area of approximately 11.2 to 13.8 g/m².

As shown in FIG. 3, an identical, corresponding array of layers is provided between the outer layer 50 and the core layer 52. These include a dielectric layer 68, a conductive layer 70, a dielectric layer 72, a conductive layer 74, a dielectric layer 76, and a conductive layer 78. Note should be taken of the fact that copper layer 60 and corresponding copper layer 74 on the opposite side of the symmetry plane 54 are interspersed among the layers of CE/E-ePTFE (which has a manufacturing thickness tolerance considerably greater than the copper layers) and BT-epoxy/glass to meet the electrical needs of the apparatus, i.e., the circuit (which has a manufacturing thickness tolerance greater than CE/E-ePTFE) traces for the conductors and, as such, are not true copper layers, but are a pattern of copper conductors. The principle of this aspect of the invention, that the better controlled thickness materials are positioned toward the outside of the package 12, and the layers with lower thickness control positioned closer to the core layer 52 must be violated occasionally, as it can be seen with respect to the CE/E-ePTFE layer 66, to satisfy the primary electrical needs of the microchip package.

Because the thicknesses of the copper layers 54, 70 and 64 can be carefully controlled and the BT-epoxy/glass and CE/E-ePTFE layer thicknesses can also be controlled, but not as well as the copper layer thicknesses, the interposition of these copper layers among the B-T epoxy/glass and CE/E-ePTFE does not aggravate the CTE response of the substrate 12, but further serves to reduce the aggregate CTE of the substrate 12. The principal feature of this aspect of the invention, consequently, is characterized in the fact that the manufacturing tolerances, and thus, the potential for departing from a predetermined layer thickness and aggravating the overall CTE response of the substrate 12 is greater for the CE/E-ePTFE layer 66, which also has the highest CTE of any of the layers, than it is for any of the other layer materials in the substrate 12.

Other appropriate layer materials can be substituted for those which are described in connection with FIG. 3, it only being necessary to arrange the layers according to the principles expressed above. For example, FR 4, a common dielectric material (or any suitable dielectric material) layer can be substituted for the BT-epoxy/glass layers shown in FIG. 3. Moreover, a greater or lesser number of layers forming the laminated package 12 can be employed.

To illustrate more clearly the improvement in the mechanical properties of the substrate 11 through the practice of this aspect of the invention, attention is invited to the following table:

|  | Prior Art Construction | FIG. 3 Construction |
|---|---|---|
| Flexural Modulus (GPa) | 6.5 to 10.3 | 19.4 to 26. |
| CTE (ppm/°C.) | 30.2 to 32.4 | 21.4 to 23.0 |
| Warpage (μm) | 388 | 83 |

[1]GPa=$10^9$ pascals, in which one pascal is equal to one newton/m².

The compositions of the layers that form the substrate 12 can be changed through a substitution of other known substrate layer materials, as noted above, it being clear that the improved performance that is provided through the invention is attained by positioning those layers with the greatest manufacturing thickness tolerances (usually the dielectrics) as the innermost layers in the substrate.

As evident from the above, the arrangement of individual layers in the laminated substrate or package 12 is selectively made to achieve dimensional control, increased flexural stiffness, and matching of CTEs within the substrate. Thus, it is important that the layers on opposite sides of the plane of symmetry are made of the same material and have the same thickness to avoid CTE differentials within the substrate. Not only is it desirable to place the metal layers on the outer layers of the laminated substrate, but it is also desirable to make the outer metal layers thicker than the inner metal layers to enhance flexural stiffness.

III Unit Area Composition Control

Another aspect of the present invention is to analyze the material composition of each layer to determine whether offsetting formations in opposing layers should be made to ensure that the CTEs of the two layers are matched.

Figure 4:
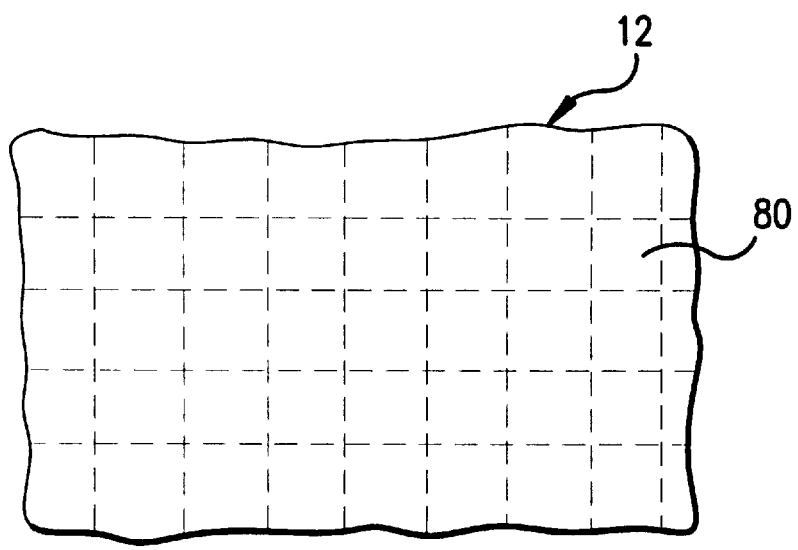
FIG. 4 is a plan view of a portion of the package, showing a grid pattern for analyzing the material content within each grid of each layer of the package.

For example, and referring to FIGS. 3 and 4, conductive layer 60 is a patterned layer that may have areas where metal has been removed to form a circuit. At an area of the layer 60 where metal is removed, a corresponding area of symmetrically disposed conductive layer 74 may have a different metal content, resulting in localized differences in CTE between the two layers 60 and 74. The differences in CTE can result in warping. The same would be true for layers formed by deposition, where more or less metal is deposited on the different but symmetrically opposed layers.

One aspect of the present invention is to analyze the material content of one layer, and then alter the opposing layer to match the material content. Referring to FIGS. 3 and 4, substrate 12 is divided into an array of unit area squares 80. These squares measure, for example, 1 mm$^2$. The squares 80 extend in space through all layers of the package so that each square of one layer has a counterpart area in a symmetrically opposed layer.

The compositions of each layer in the substrate 12 that are within the confines of each of the respective squares in the array of squares are analyzed to identify the materials and the concentrations of each of these materials in every layer of the unit area under consideration.

This concentration, or distribution of materials within each layer is developed from the original data in the design files for the layer or through analysis of the mask work for the layer. For example, as shown in FIG. 3 and 4, the copper layers 60 and 74 are not, as mentioned above, true layers, but are a distribution of conductors within the package 12 that establish appropriate conductors for the electrical connectors. To better illustrate this situation, attention now is invited to FIG. 5, which shows a plan view of the section V—V in FIG. 3.

Figure 5:
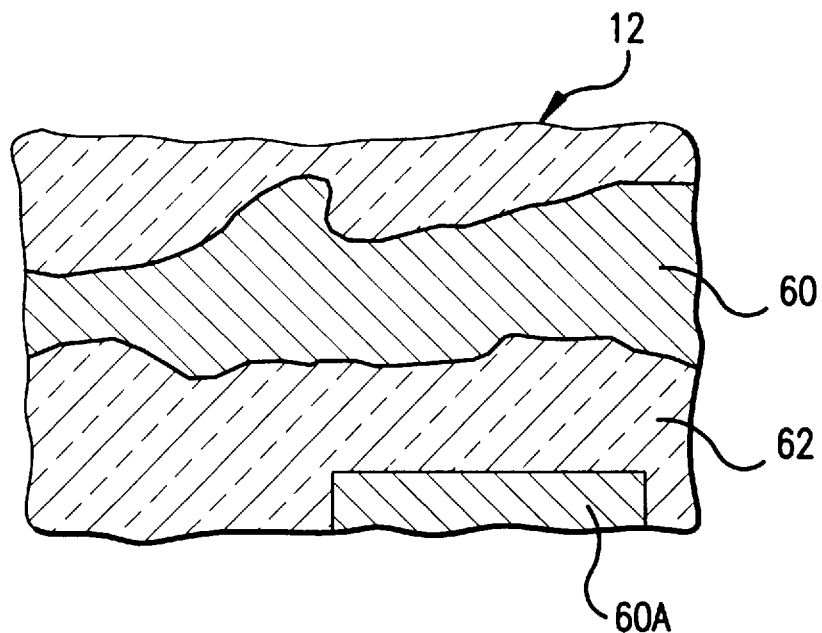
FIG. 5 is a horizontal sectional view, taken along line V—V of FIG. 3.

As shown in FIG. 5, the copper conductors that comprise the "layer" 60 do not extend across the entire area of the substrate 12, but only occupy a small non-uniform or unequally distributed portion of the copper in that area, the BT-epoxy/glass layer 62 being exposed in those portions of the plan view area of the substrate 12 that are not covered by the copper conductors which comprise the layer 60.

Figure 6:
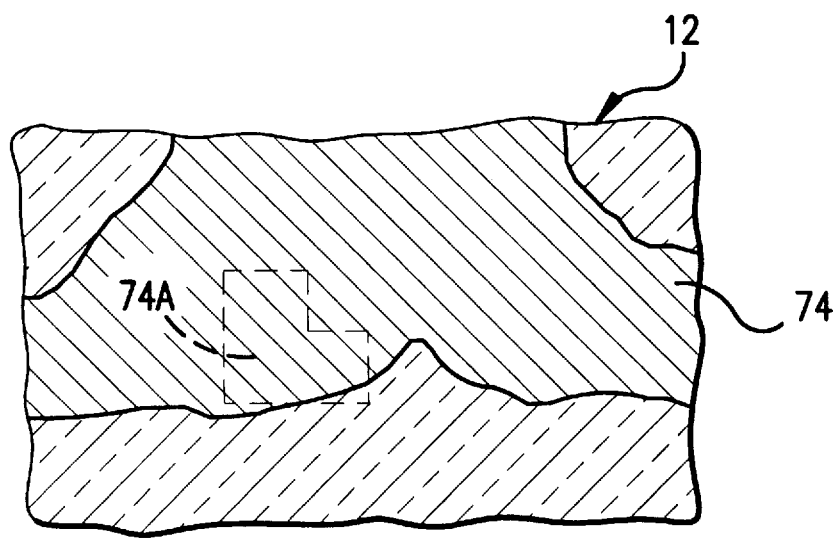
FIG. 6 is a horizontal sectional view, taken along line VI—VI of FIG. 3.

FIG. 6, in turn, shows the unequal or non-uniform disposition of the copper electrical conductors 74, and the somewhat larger concentration of copper in the conductors that form the layer 74 in comparison with respect to the quantity of copper in the layer 60.

In this manner, the illustrative copper concentration per unit area in the layers can be developed. As shown in FIG. 6, the adjusted concentrations of copper in common unit areas 80 in each of the layers 60 and 74 are not identical because of electrical circuit requirements that are imposed on these layers. The electrically inactive copper strip 60A in the layer 60 and the electrically unnecessary copper portion 74A that is removed from the layer 74 nevertheless do establish an approximate balance between the two copper electrical circuit layers 60 and 74. Warping can be reduced considerably in the substrate 12 by balancing the concentrations of the same substrate layer materials. Balancing, for this purpose, is defined as establishing equal concentrations, or void spaces on opposing pairs of layers that are at equal distances from the plane of symmetry.

For example, to balance the amount of copper in the layer 60 (FIG. 5) to approximate the quantity of copper in the companion layer 74, a strip of electrically inactive copper 60A is added to the surface of the BT-epoxy/glass layer 62. Alternatively, the relative copper concentrations also can be balanced by removing an equivalent amount of electrically unnecessary copper 74A from the electrical conductors that form the layer 74.

Of course, perfect balance can not be achieved in actual practice. Balance, for the purpose of this invention, is reached to the extent that the electrical requirements of the circuit are satisfied while nevertheless establishing as close an approximation to an equality between the respective copper concentrations in each of the layers as the physical structure will permit. Where an imbalance of bending moments exists between one opposed pair of layers, e.g., layers 60 and 74, the imbalance may be compensated for by purposely imbalancing a second pair of layers, e.g., 64 and 70, so as to create an equal and opposite bending moment.

Naturally, it is within the scope of the invention to strive for balance by using any one or more of the three foregoing techniques to approximate the desired goal.

Although a specific example of the invention is described in connection with the electrical conductor layers 60 and 74, balance, as defined for the purpose of this invention, also should be sought among the constituents that are incorporated in the Cu/Ni/Au layer 56, the CE/E-ePTFE layer 58 and the BT-epoxy/glass layer 62 through the process described above with respect to copper.

In this way, by establishing a general balance, or equality, in constituent concentrations among the layers that are within each of the unit area squares that are defined by the unit area squares 80, curving and the otherwise undesirable CTE bending moments are overcome, to a large extent.

This technique for manipulating the layer constituent materials concentration is not at all limited to the substrate 12, but can be applied successfully to all or some of the other components of chip/package system, including the lid and constraining ring.

An essential part of the foregoing is that the CTE of the opposing layers is matched locally. Thus, when using the same materials for opposing layers in a laminated structure, the areas overlying each other, meaning a common zone, has an approximately similar amount of material, either by altering one or the other, or both, of the two layers. The alternation can be in the form of material additions, such as by deposition, or material subtractions, such as by etching. The effect is the same: the package reliability is enhanced by accounting for CTE gradients across the length and width of the individual, symmetrically matched layers.

IV Die Area CTE Control

Referring again to FIGS. 1 and 2, an integrated circuit chip, such as chip 18, is typically made of a material, such as silicon, that has a substantially different coefficient of thermal expansion (CTE) as compared to an underlying package made of non-ceramic materials, such as the package 12. These differences in CTE apply stress to the solder ball connections that attach the chip 18 to the package 12.

A solution to this problem entails making the package have two different CTES, one approximately matching that of the printed wiring board (PWB) 40 and the other approximately matching that of the chip 18. In other words, the CTE characteristics of the chip 18 are matched approximately to the CTE of the portion 12A of the substrate 12 that is directly under the chip 18.

In general, since the chip 18 has a lower CTE than that of organic packages, the portion 12A of the package will have a lower CTE than the surrounding area of the substrate. That is not to say, however, that the conditions could not be reversed, where for purposes of mounting other or different components, the center area could have a higher CTE than the surrounding area.

Creating a different CTE for the middle, chip-mounting area 12A of the package 12 can be accomplished in a variety of ways. One is to use different materials in the multi-layered structure for the central region, such that the materials themselves are chosen to provide a different CTE. The combination of layered materials for the portion 12A of the package 12 that is under the chip 18, e.g., copper, molybdenum or Invar, are selected to produce an overall CTE in the region 12A that is similar to but generally greater than the CTE of the chip 18 through the normal range of operating temperatures for both the chip 18 and the package 12. In this manner, undesirable relative movement between the chip 18 and the substrate 12 is largely eliminated.

Having approximated the CTE of the portion 12A of the package 12 to the CTE of the chip 18, it has been found, also in accordance with the invention, that the average CTE of the entire package 12 now should be matched to the CTE of the PWB 40 to which the package 12 and its attached chip 18 are joined. Failing to essentially approximate the CTE of the PWB 40 with that of the aggregate CTE for the package 12 and the chip 18 can lead to the generation of a thermally created bending and shearing movement between the PWB 40 and the package 12. The unbalanced forces thereby created between the PWB 40 and the package 12 are transferred to the chip 18 which responds to this curving and relative movement in the undesirable manner noted above, e.g., shearing the soldered electrical connections or the electrical connections between the package and the PWB 40. In a similar manner, solder balls 42 used to make electrical connections between the package 12 and the PWB 40 also are subject to undesirable shearing events. In a typical embodiment of this aspect of the invention, the following components and their illustrative CTE characteristics that are to be reconciled are as follows:

| Component | | CTE (PPM/°C.) |
|---|---|---|
| chip 18 | package | 2–3 |
| 12 | PWB40 | ≈20 |
| | | 16–17 |

Accordingly, the area 12A of the package 12 under the chip 18 should enjoy a CTE as close to the range of 2–3 PPM/°C. as is possible, illustratively 6 to 10 PPM/°C. The aggregate or average CTE of the package 12 also should be in the 16–17 PPM/°C. range in order to approach the printed circuit board CTE. Expressed in mathematical terms:

$$\alpha = \frac{\iint \alpha(x,y)dxdy}{\iint dxdy}$$

where α=Spatially varying package 12 CTE in the x,y plane; and

α=Average CTE for the entire package 12.

The use of a different CTE for a chip-underlying portion of a package is particularly suited for flip chip packages or others employing peripheral ball grid array connectors between the package and the PWB. As seen in FIG. 2, solder balls are not used between the PWB 40 and the package 12 in the area underlying the chip cavity 30. The reason is that there will be a CTE mismatch between the area 12A of the package 12, now lowered to match the CTE of the chip 18. However, some or all of the area under the chip 18 may be populated with solder balls 42 if the relative movement between the PWB 40 and the chip/package combination can be tolerated in the specific application.

While the embodiment illustrated and described above focuses on a substrate having two discrete regions and two discrete CTEs, several additional regions could be encountered, particularly when mounting multiple chips on the package, as in multi-chip modules (MCMs). Moreover, the chip mounting region does not have to be centrally located but can be disposed virtually in any position on the package.

V Selective CTE Adjustment

Where it is desirable to have a different CTE in different regions of the package 12, as for instance, when attempting to match the CTE of the package to two different components, the CTE can be varied by physically altering the layered structure that forms the package 12.

Figure 7:
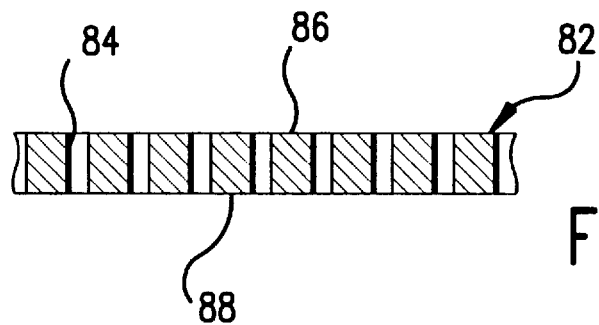
FIG. 7 is a vertical sectional view of a layer used to form the package, and showing a plurality of pre-lamination holes.

Referring FIG. 7, a core layer 82 is drilled, etched or otherwise worked to include a plurality of transversely oriented holes 84 which extend through the core layer from one surface 86 to the opposite surface 88. The core layer 82 is one that would correspond to the core layer 52 of FIG. 3, and as with layer 52, the core layer is usually made of copper.

Figure 8:
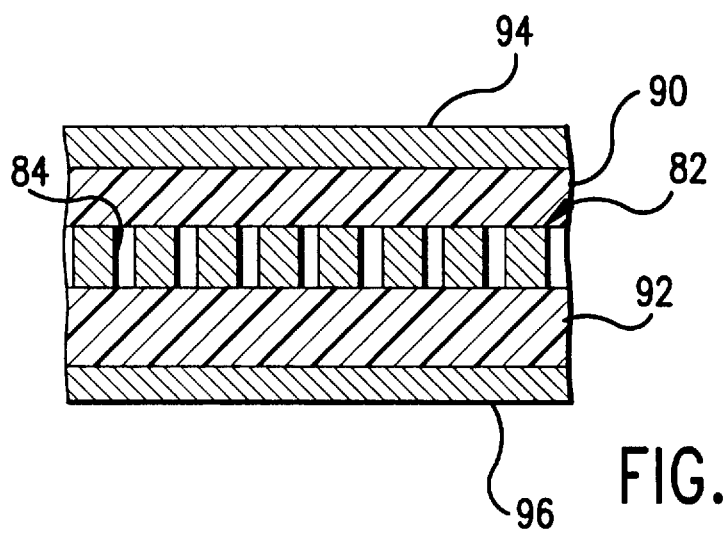
FIG. 8 is a vertical sectional view of the perforated layer in a pre-lamination stack with dielectric layers and outer conductive layers.

In FIG. 8, the core layer 82 is shown stacked between two dielectric layers 90 and 92. Typically, a lamination assembly of layers will additionally include conductive layers 94 and 96 disposed respectively on opposite sides of the dielectric layers 90 and 92.

Figure 9:
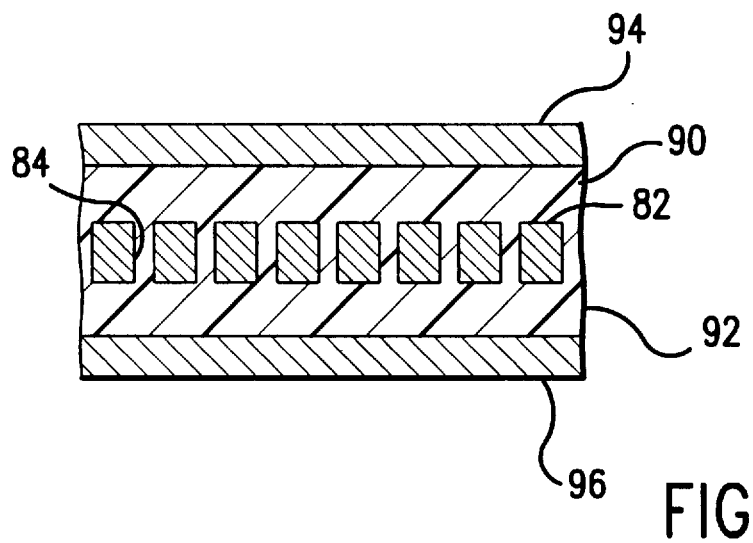
FIG. 9 is a vertical sectional view of the stack of layers of FIG. 8 after lamination, in which material from the dielectric layers flows into and fills the plurality of holes.

When the dielectric layers are made of an organic material which just before pressing is in a b-stage, the dielectric material flows into and fills the holes 84, as shown in FIG. 9. The core layer 82 thus becomes a composite which includes a copper matrix having dielectric material dispersed therethrough. The dielectric material has a higher CTE than copper and thus, the CTE of the core layer is increased where the holes 84 are present.

Alternatively, the holes 84 could be filled with any material prior to lamination to achieve a desired effect on the CTE of the package. For example, a filler having a lower CTE could fill the holes 84 as a liquid and solidified before passing the core 82 on the lamination step.

Figure 10:
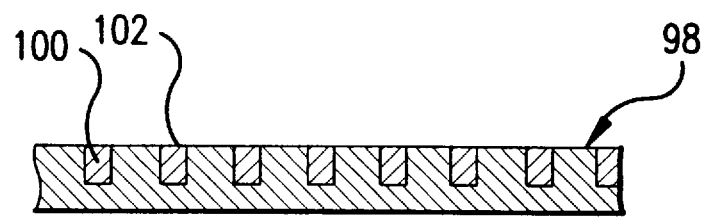
FIG. 10 is a vertical sectional view of an alternative embodiment in which the layer is grooved instead of perforated, and filled with a filler material before lamination.

As a further alternative, and referring to FIG. 10, a core layer 98 can be machined, etched or otherwise worked to form one or more grooves 100 which are filled with a filler material 102 which is selected to achieve a desired CTE change. A lower CTE filler will lower the CTE of the core 98, and a higher CTE will raise the core CTE.

Whether holes, grooves or other formations are used, the core can be worked with any number of known techniques, such as laser drilling, machining, punching, etching, etc. Moreover, the formations are not necessarily made to the core layer of a laminated package, but could be made in any layer, whether dielectric or conductive.

When making formations in layers beyond the core layers, the symmetric counterpart layers must be similarly modified. For example, in FIG. 3, if holes are to made and filled in the conductive layer 64, the same pattern of holes and same filler must be used in the same position of the symmetrically opposed conductive layer 70.

Figure 11:
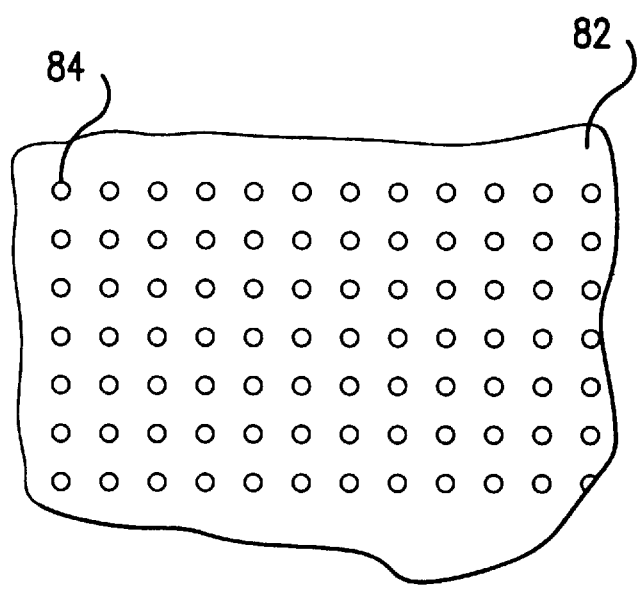
FIG. 11 is a plan view of a perforated layer, with the holes formed in a desired pattern.

As seen in FIG. 11, the holes 84 can be arranged in a grid-like pattern in the core layer 82 in a relatively tightly packed arrangement where localized changes in CTE are required. For example, to match the CTE of the package 12 in an area under the chip 18 (FIG. 2), the core layer 82 can be patterned with holes in the chip mounting area that overlies the core layer. The holes are then filled with a material that increases or decreases the CTE of the package in that area.

VI Chip Package Lid CTE Adjustment

As mentioned above, the chip 18, which can be on the order of 1 cm² to 4 cm² generates an unusual amount of heat, on occasion as much as 100 watts. To avoid degrading or even destroying the electrical characteristics of the chip 18, it is necessary to provide some means for dissipating this heat to enable the chip 18 to continue operation within an acceptable temperature.

To provide this important function of dispersing heat generated by the chip 18 to the lid 32 for subsequent dissipation, in accordance with this aspect of the invention, it has been found that using a paste of the type described in the Ameen et al. '473 patent and the paste dielectrics described herein provide a suitable thermally conductive, CTE matching adhesive in the volume for joining the chip 18 to the lid 32.

Another way, in accordance with a further principal of the invention, for approximating the CTE of the lid 32, in turn, to the CTE of the chip 18 and to the considerably different CTE of the constraining ring 22 and package 12 in order to reduce the degree of bending caused by mismatched CTE characteristics is through a manipulation of the material composition of the lid 32.

As mentioned above, prior art lids usually were formed from either aluminum or copper or a composite material, e.g., by adding either aluminum or copper to silicon carbide or some other low CTE reinforcement matrix. Aluminum, for instance, has a CTE of 23 PPM/°C. and pure silicon carbide has a CTE of 3.7 PPM/°C. Consequently, the potential exists for the lid 32 to enjoy a predetermined CTE anywhere in the range between 3.7 PPM/°C. for pure silicon carbide to 23 PPM/°C. for pure aluminum.

In accordance with the present invention it has been determined that the lid should be provided with different regions of CTE to match the different components of the chip/package 10 to which the lid 32 is in thermal and physical contact. This can be accomplished in a variety of ways. For example, the lid 32 can be made of a metal matrix material which includes silicon carbide and aluminum. The concentration of materials can be varied to achieve a desired two-region CTE in the lid, and in particular, the central region of the lid, corresponding positionally to the chip 18, will be configured to have a lower CTE than the surrounding region of the lid 32, which preferably is CTE matched to the higher CTE constraining ring 22.

Figure 12:
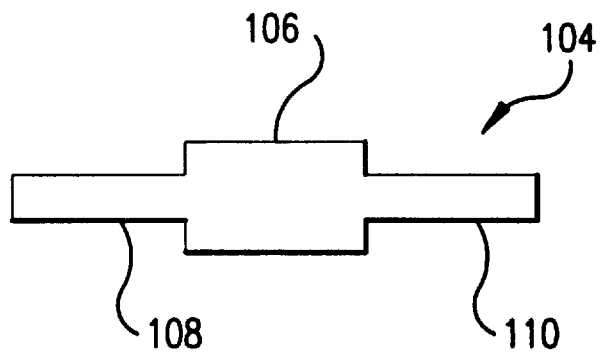
FIG. 12 is a side elevational view of a preform used to manufacture a lid having different regions of CTE.

A two-region CTE lid can be constructed in the following manner. Referring to FIG. 12, a preform 104 is made of silicon carbide powder or whiskers. The preform can be pressed to achieve a desired shaped, or can be machined or cut to form its desired shape. The desired shape is one where the middle region 106 has a thicker dimension than the outer regions 108 and 110. The preform 104 can be made using standard powder metallurgy techniques.

Figure 13:
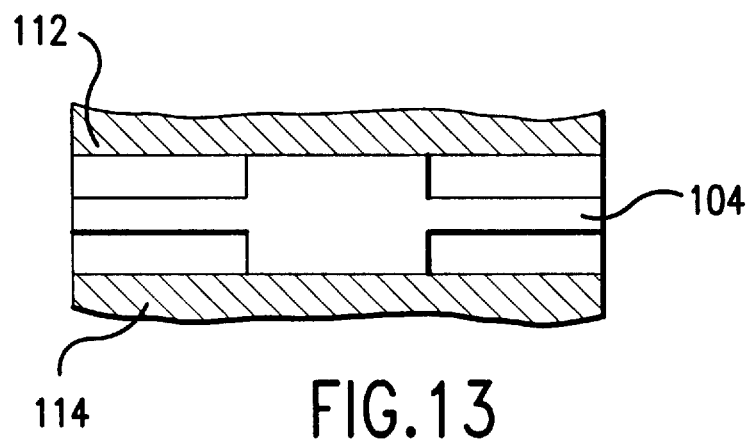
FIG. 13 is a sectional view showing the preform in a mold for pressure infiltrating molten metal into the ceramic preform of FIG. 12.
Figure 14:
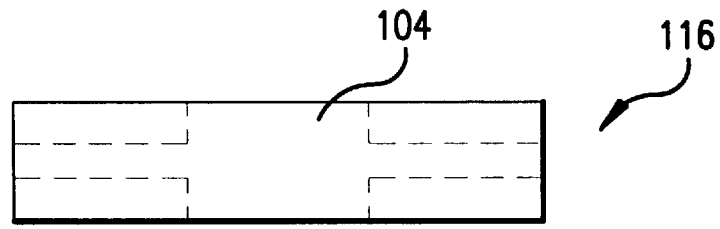
FIG. 14 is a side elevational view of the completed lid after molding.

The preform 106 is next placed in a mold and pressure infiltrated with molten aluminum. As seen in FIG. 13, the mold die 112 and 114 approximately abut the middle region of the preform, and form voids around the outer regions. After pressure infiltration, and as shown in FIG. 14, a finished lid 116 has the overall shape desired to fit the package 12, but since the middle region has a higher concentration of silicon carbide, the middle region will have a lower CTE. Specifically, the lower CTE is designed to approximately match that of the chip, which is about 2.6, while the outer regions having higher concentrations of higher CTE aluminum, approximately matches that of the constraining ring.

Because the peripheral portion of the lid that is bonded to the constraining ring should have a high aluminum and low silicon carbide concentration to approach the CTE for the ring, in absorbing the aluminum in the peripheral portion of the silicon carbide that forms the lid, relatively more aluminum is added to this peripheral portion than to the central portion of the lid. By selecting the relative concentrations in respective portions of the lid, the average CTE of the lid matches the average CTE of the package 12 and the different average CTE of the chip 18. This manipulation of relative aluminum and silicon carbide concentrations in the lid permits the microchip package and components to remain essentially flat while reducing the stress applied to the die or the adhesive interface.

The large central portion of the silicon carbide preform, which is essentially porous, establishes a ratio of aluminum to silicon carbide in the different regions of the finished lid. As noted, a greater concentration of aluminum relative to the silicon carbide is required in the vicinity of the ring. These concentrations are established by dissolving aluminum in the preform and filling the voids above and below the outer regions of the preform. In this way, a concentration of aluminum and silicon carbide producing a CTE that approaches the CTE of the ring in one region and the chip in another region is provided.

As a result, a technique now is available through the practice of the invention that enables the CTE of certain portions of the lid to be established to essentially match the CTE characteristics of other components of the chip/package system 10 (FIG. 1 that are bonded to the corresponding portions of the lid.

While silicon carbide/aluminum systems are described above, other materials may be used to form lids exhibiting different CTEs in different regions. It is also possible to use a single powdered material, ceramic or metal, and vary the CTEs in different regions by applying different consolidation forces. For example, the middle region could have a greater or lesser theoretical density than the outer regions, which could provide a sufficient difference of CTE in some cases. In this case, the powdered materials can be selected and/or mixed attain the desired differential in CTE.

Figure 15:
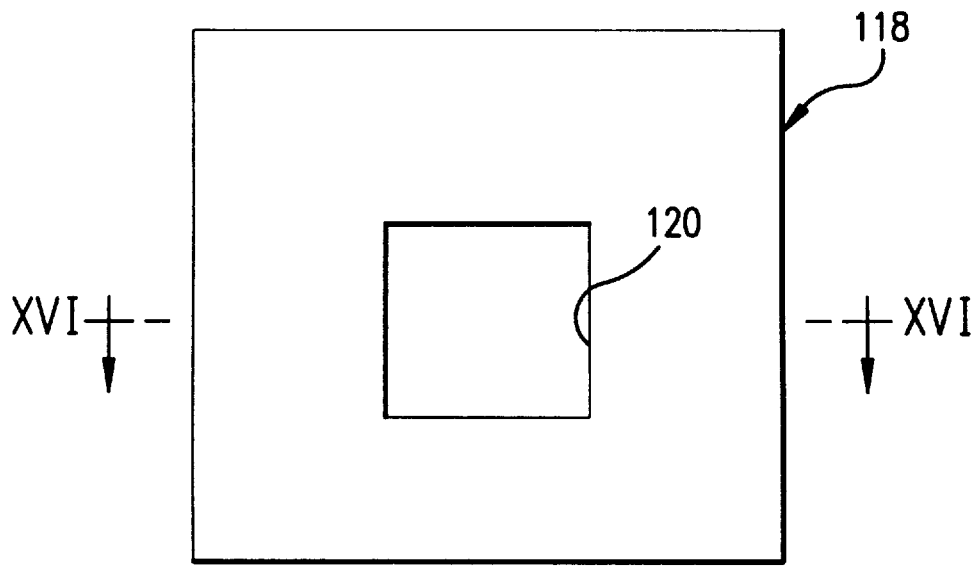
FIG. 15 is a side elevational view of a lid having an opening in the middle for receiving an insert having a different CTE than the remainder of the lid.
Figure 16:
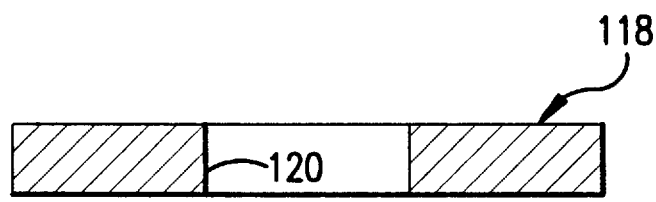
FIG. 16 is a vertical sectional view of the lid of FIG. 15, taken along line XVI—XVI of FIG. 15.
Figure 17:
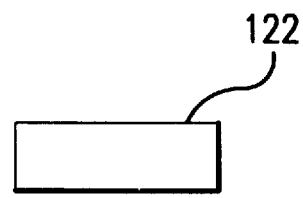
FIG. 17 is a side elevational view of an insert used to complete the lid shown in FIGS. 15 and 16.

An alternative embodiment is illustrated in FIGS. 15–17, in which a lid 118 is made to include a central opening 120. An insert 122 is sized to fit in the opening 120. The insert 122 is made of a material that has a CTE that is different than that of the material used to form the lid 118. In particular, if a lower CTE is desired for the middle region of the lid, as when the middle region overlies the chip, the insert can be made of material having a lower CTE than the rest of the lid.

To accomplish the embodiment of FIGS. 15–17, the lid 118 can be made as a single piece and the central opening 120 can be machined out, or the opening can be formed integrally, as when the lid is made from powdered metal or ceramic. The insert can be formed by the same techniques and may for example comprise a silicon carbide preform infiltrated with aluminum. At any rate, the CTE of the insert can be customized to match that of the chip while the lid 118 CTE can be customized to match that of the constraining ring.

Also, a higher concentration of silicon carbide in the center region of the lid can be accomplished by removing the center region of a low density porous silicon carbide preform which has the same dimensions of the desired lid. Into this central cavity is placed a slug of high density porous silicon carbide which fills the cavity. After impregnating this preform with aluminum, a lid with a center region of high silicon carbide concentration and a peripheral region of lower silicon carbide concentration results.

VII CTE Cancellation

Figure 18:
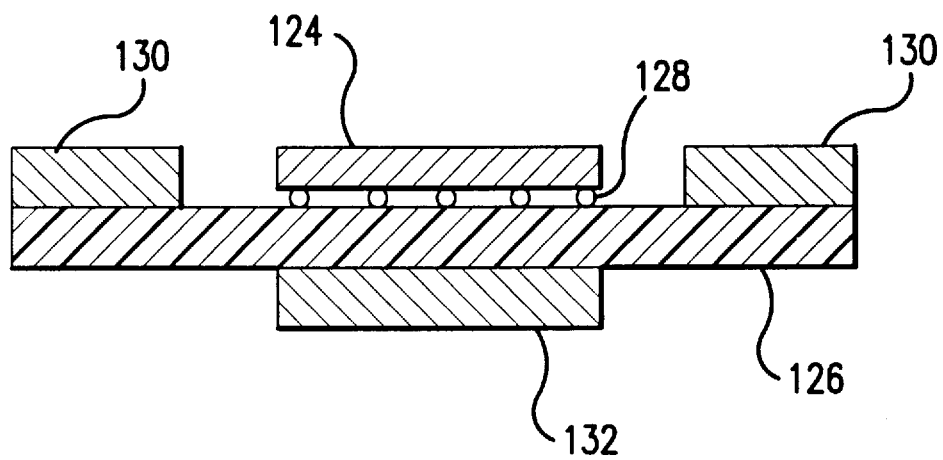
FIG. 18 is a sectional view showing a false die attached to an underside of the package opposite the chip.

Referring now to FIG. 18, a chip 124 is shown mounted on a package 126 through solder balls 128. A constraining ring 130 is mounted to the upper surface of the package 126.

Due to the difference in CTE between the chip 124 and the package 126, a bending moment is generated that acts upon the chip 124 and can potentially compromise the flatness of the chip. The differences in CTEs are largely due to the material differences in that the chip 124 is silicon and the package is one which utilizes thin organic dielectric layers made of the materials described herein.

According to the invention, a false die 132 is bonded to the lower surface of the package 126 prior to bonding the chip to the package. The false die 132 is CTE matched to the chip 124 and tends to oppose the bending moments that are generated by the chip/package attachment, particularly as the underfill adhesive is cured. Thus, the false die 132 counterbalances the moments during chip attach with opposing bending moments.

The false die 132 can be made of silicon but other materials exhibiting CTEs similar to the chip 124 can be used. However, it should be positioned directly opposite to the chip 124. Also, materials having different CTEs over the silicon chip could be used, if made thicker to resist the bending moments. For example, aluminum has a CTE of about 9, but could be used if made thick enough to get the same effect.

A further aspect of this invention is to adhesively bond the false die to the package at the same time the underfill adhesive is applied to the region between the chip 124 and the package 126. The co-curing of both adhesives will ensure that the false die bending moments offset bending moment generated by adhesive shrinkage at the underfill.

While the false die 132 can be a passive stiffener, it can also take the form of an electrical component such as a capacitor formed on the package. Also, the false die could be a real chip that failed quality control or it can be one or more circuit components that are frequently referred to as "passive" components, e.g., capacitors, resistors and inductances. The significant point being, however, that the passive component, throughout the range of anticipated operating temperatures for the microchip package, should provide thermal expansion caused bending moments that are essentially equal to, but opposite in direction to, those created by the chip.

In this manner, the forces that otherwise would warp or bend the chip and the substrate being equal but on opposite sides of the substrate mutually cancel each other. The physical consequence of the balance between these equal and opposing forces is to cancel each other, and thereby enable the chip to remain essentially flat.

The following table is illustrative of the experimentally developed effects of various materials, used as the electrically passive components.

Effect of Different Materials

Deflection, Stresses and Critical Flaw Size on Cooling from 150° C. to 25° C.

| Inactive Die Material | Materials Properties | Die Deflection ($\mu$m) | Package Deflection ($\mu$m) | $\sigma 1$ (Mpa) | ac (mm) |
|---|---|---|---|---|---|
| Silicon | E = 130 Gpa<br>$\nu$ = 0.28<br>$\alpha$ = 2.6 × $10^{-6}$°C$^{-1}$ | −1.1 | −62.6 | 11.7 | 1.141 |
| 96% Al$_2$O$_3$ | E = 320 Gpa<br>$\nu$ = 0.2<br>$\alpha$ = 7.0 × $10^{-6}$°C$^{-1}$ | −28.5 | −186.2 | 15.0 | 0.860 |
| 12/85/12 CIC | E = 140 Gpa<br>$\nu$ = 0.3<br>$\alpha$ = 4.4 × $10^{-6}$°C$^{-1}$ | −13.8 | −119.0 | 12.4 | 1.259 |
| Mo | E = 317 Gpa<br>$\nu$ = 0.3<br>$\alpha$ = 5.0 × $10^{-6}$°C$^{-1}$ | −14.0 | −119.8 | 13.3 | 1.094 |

Illustrative of the improvement afforded by different stiffener materials to maintain die area and microchip package flatness, attention is invited to the following table:

Effect of Different Die Area Stiffeners (prior to chip attach)

| Stiffener Material and Thickness | Maximum Die Non-Planarity | Maximum Package Non-Planarity |
|---|---|---|
| 381 $\mu$m Copper | −9.7 $\mu$m | −107 $\mu$m |
| 254 $\mu$m Copper | −11.4 $\mu$m | −108 $\mu$m |
| 71 $\mu$m Copper | −14.9 $\mu$m | −120 $\mu$m |
| 35 $\mu$m Copper | −16.8 $\mu$m | −132 $\mu$m |
| 381 $\mu$m Silicon | +69.7 $\mu$m | −47 $\mu$m |
| 71 $\mu$m Silicon | +64.3 $\mu$m | −80 $\mu$m |
| 381 $\mu$m Alumina | +29.9 $\mu$m | −74 $\mu$m |
| 71 $\mu$m Alumina | +50.9 $\mu$m | −91 $\mu$m |

Industrial Utility

Each of the embodiments of the invention described above significantly contribute to an improved microchip package through the essential elimination, control or reduction of relative movement among the individual components that form the microchip package, without limitation to the source of this relative movement. Thus, through CTE-based warpage, bending due to manufacturing tolerances in the different substrate layers, or the like, each of these sources of relative movement among the microchip package components and the undesirable consequence of such movement, is alleviated to a significant extent.

As discussed above, the adhesives 28 and 38 can be a variety of adhesive materials. In one embodiment, adhesives include a fluoropolymer material, such as, is a porous polytetrafluoroethylene (PTFE), and especially an extruded and/or expanded PTFE, such as that taught in U.S. Pat. No. 3,953,566 to Gore. The material is usually porous expanded PTFE which has been stretched at least 2 to 4 times its original size in accordance with U.S. Pat. No. 3,953,566. This stretching created pores that act as natural air reliefs when the filled material is urged between two components. In addition, because of the nature of the expanded PTFE, stresses created due to mismatches in the thermal coefficients of expansion between component parts may be relieved in this conductive layer if it placed between them.

Suitable interface compositions include PTFE with about 50 to 60% by volume of the solid components of ZnO, BN, or any other good thermally but electrically non-conductive filler. The final product may be expanded in ratios of 4:1 or 3:1 or 2:1 to achieve the desired degree of conformability. As has been noted, the presence of the pores created from the expansion process is responsible for the conforming nature of the finished product and aids in the relief of trapped air when this material is placed between two parallel plates and then are urged together. These materials may be formed into any suitable shape, such as thin tapes having thicknesses in the 5 to 15 mil (0.127 to 0.381 mm) range.

Another suitable composition for use in the present invention involves filling the PTFE with a metal powder, such as copper or nickel, having particle sizes in the 1 to 40 micron range. Bimodal and trimodal distributions can increase the loading of this material, such as providing particles in the 1 to 5 micron range mixed with particles in the 40 to 45 micron range. This allows greater packing density, with a subsequent increase in thermal conductivity without sacrificing conformability. The total volume percent (including air) of metal to finished filled PTFE is in the 20 to 90% range. The finished material 17 and 56 can be a material that is a porous matrix system which is imbibed or impregnated an adhesive-filler mixture.

In another embodiment of the present invention, the adhesives 17 and 56 are a porous matrix that is a non-woven substrate imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 and 4,482,516, each of which is incorporated herein by reference. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting the ratio of the mean flow pore size to average particle size to be greater than 1.4. Acceptable composites can also be prepared when ratio of the minimum pore size to average particle size is at least above 0.8, or the ratio of the minimum pore size to the maximum particle size is at least above 0.4. The MFPS to particle size ratios may be determined with a Microtrak® Model FRA Particle Analyzer device.

Alternatively, another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made prepared by paste extrusion and incorporating sacrificial fillers, porous inorganic or organic foams, or microporous cellulose acetate, can also be used.

The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles.

The filler comprises a collection of particles when analyzed by a Microtrak® Model FRA Particle Analyzer device, which displays a maximum particle size, a minimum particle size and an average particle size by way of a histogram.

Suitable fillers to be incorporated into the adhesive include, but are not limited to, $BaTiO_3$, $SiO_2$, $Al_2O_3$, ZnO, $ZrO_2$, $TiO_2$, precipitated and sol-gel ceramics, such as silica, titania and alumina, non-conductive carbon (carbon black) and mixtures thereof. Especially preferred fillers are $SiO_2$, $ZrO_2$, $TiO_2$ alone or in combination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by silylating agents and/or agents reactive to the adhesive matrix, such as by using coupling agents. Suitable coupling agents include, silanes, titanates, zirconates, and aluminates. Suitable silylating agents may include, but are not limited to, functional silylating agents, silazanes, silanols, siloxanes. Suitable silazanes, include, but are not limited to, hexamethyldisilazane (Huls H730) and hexamethylcyclotrisilazane, silylamides such as, bis(trimethylsilyl)acetamide (Huls B2500), silylureas such as trimethylsilylurea, and silylmidazoles such as trimethylsilylimidazole.

Titanate coupling agents are exemplified by the tetra alkyl type, monoalkoxy type, coordinate type, chelate type, quaternary salt type, neoalkoxy type, cyclo-heteroatom type. Preferred titanates include, tetra alkyl titanates, Tyzor® TOT {tetrakis(2-ethyl-hexyl) titanate, Tyzor® TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)-pyrophosphato titanate.

Suitable zirconates include, any of the zirconates detailed at page 22 in the Kenrich catalog, in particular KZ 55-tetra (2,2 diallyloxymethyl)butyl, di(ditridecyl)-phosphito zirconate, NZ-01-neopentyl(diallyl)oxy, trineodecanoyl zirconate, NZ-09-neopentyl-(diallyl)oxy, tri(dodecyl) benzene-sulfonyl zirconate.

The aluminates that can be used in the present invention include, but are not limited to Kenrich®, diisobutyl(oleyl) acetoacetylaluminate (KA 301), diisopropyl(oleyl) acetoacetylaluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as, dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polynorbornene, acetylene-terminated polyimide, polybutadiene and functionalized copolymers thereof, cyclic olefinic polycyclobutene, polysiloxanes, poly sisqualoxane, functionalized polyphenylene ether, polyacrylate, novolak polymers and copolymers, fluoropolymers and copolymers, melamine polymers and copolymers, poly(bis phenycyclobutane), and blends or prepolymers thereof. It should be understood that the aforementioned adhesives may themselves be blended together or blended with other polymers or additives, so as to impact flame retardancy or enhanced toughness.

As used herein, mean flow pore size and minimum pore size were determined using the Coulter® Porometer II (Coulter Electronics Ltd., Luton UK) which reports the value directly. Average particle size and largest particle size were determined using a Microtrak® light scattering particle size analyzer Model No. FRA (Microtrak Division of Leeds & Northup, North Wales, Pa, USA). The average particle size (APS) is defined as the value at which 50% of the particles are larger. The largest particle size (LPS) is defined as the largest detectable particle on a Microtrak® histogram. Alternatively, the largest particle size is defined at the minimum point when the Microtrak FRA determines that 100% of the particulate have passed.

In general, the method for preparing the adhesive-filler composite involves:(a) expanding a polytetrafluoroethylene sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, pressure feeding, the adhesive-filler paste into the highly porous scaffold, such as expanded polytetrafluoroethylene.

Table 1 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

EXAMPLE 1

A fine dispersion was prepared by mixing 281.6 g $TiO_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible composite. The partially-cured adhesive composite thus produced comprised of 57 weight percent $TiO_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 mm (0.0039"(3.9 mil)) dielectric laminate thickness.

EXAMPLE 2

A fine dispersion was prepared by mixing 386 g $SiO_2$ (HW-1 1-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent $SiO_2$, 5 weight percent PTFE and 42 weight percent adhesive, displayed good adhesion to copper, dielectric constant (at 10 GHz) of 3.3 and dissipation factor (at 10 GHz) of 0.005.

EXAMPLE 3

A fine dispersion was prepared by mixing 483 g $SiO_2$ (HW-11-89) into a manganese-catalyzed solution of 274.7 g bismaleimide triazine resin (BT206OBJ, Mitsubishi Gas Chemical) and 485 g MEK. The dispersion was constantly

TABLE 1

| Sample | Substrate Pore Size | | Particle Size | | MFPS | $Pore_{Min}$ | $Pore_{Min}$ | Result |
| | Min (μm) | MFPS (μm) | Avg (μm) | Max (μm) | ÷ $Part_{Avg}$ | ÷ $Part_{Max}$ | ÷ $Part_{Avg}$ | |
| --- | --- | --- | --- | --- | --- | --- | --- | --- |
| A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good | agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent $SiO_2$, 4 weight percent PTFE and 39 weight percent adhesive, displayed good adhesion to copper, dielectric constant (at 10 GHz) of 3.2 and dissipation factor (at 10 GHz) of 0.005.

EXAMPLE 4

A fine dispersion was prepared by mixing 15.44 kg $TiO_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" $TiO_2$-filled expanded PTFE (filled according to the teachings of Mortimer U.S. Pat. No. 4,985,296, except to 40% loading of $TiO_2$ and the membrane was not compressed at the end) was then dipped into the resin mixture, removed, and then dried at 165° C. for 1 min. under tension to afford a flexible composite. The partially cured adhesive composite thus produced comprised of 70 weight percent $TiO_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

EXAMPLE 5

A fine dispersion was prepared by mixing 7.35 kg $SiO_2$ (ADMATECHS SO-E2, Tatsumori LTD) with 7.35 kg MEK and 73.5 g of coupling agent, i.e., 3-glycidyloxypropyltrimethoxysilane (Dynasylan GLYMO (Petrach Systems). SO-E2 is described by the manufacture as having highly spherical silica having a particle diameter of 0.4 to 0.6 mm, a specific surface area of 4–8 $m^2/g$, a bulk density of 0.2–0.4 g/cc (loose).

To this dispersion was added 932 g of a 50% (w/w) solution of a cyanated phenolic resin, Primaset PT-30 (Lonza Corp.). In (MEK) methylethylketone, 896 g of a 50% (w/w) solution of RSL 1462 (Shell Resins, lnc.(CAS #25068-38-6)) in MEK, 380 g of a 50% (w/w) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Manganese 2-ethylhexanoate (Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w).

Figure 19:
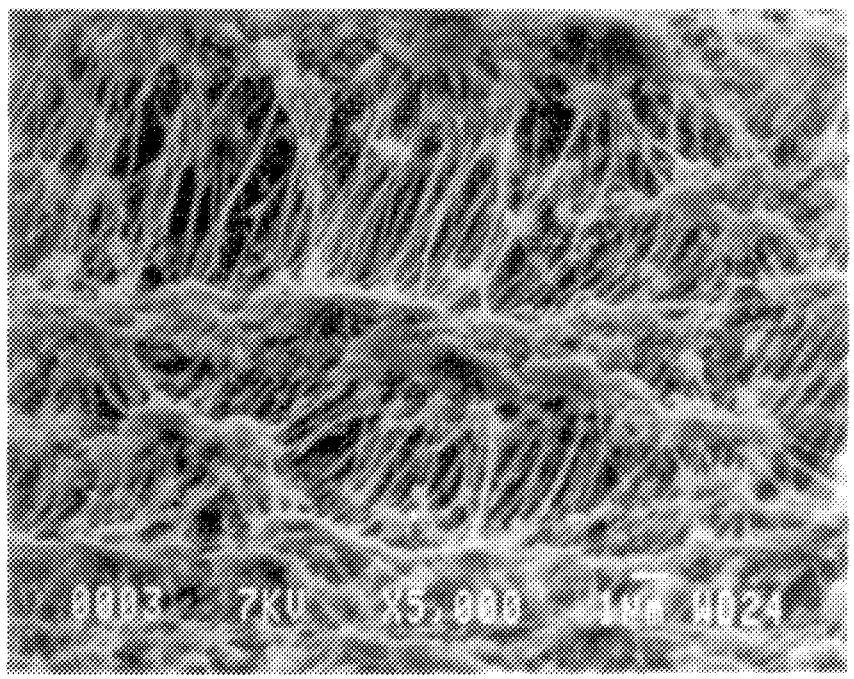
FIG. 19 is a scanning electron micrograph (SEM) image showing the node-fibril infrastructure of an ePTFE matrix used in one embodiment of the present invention.
Figure 20:
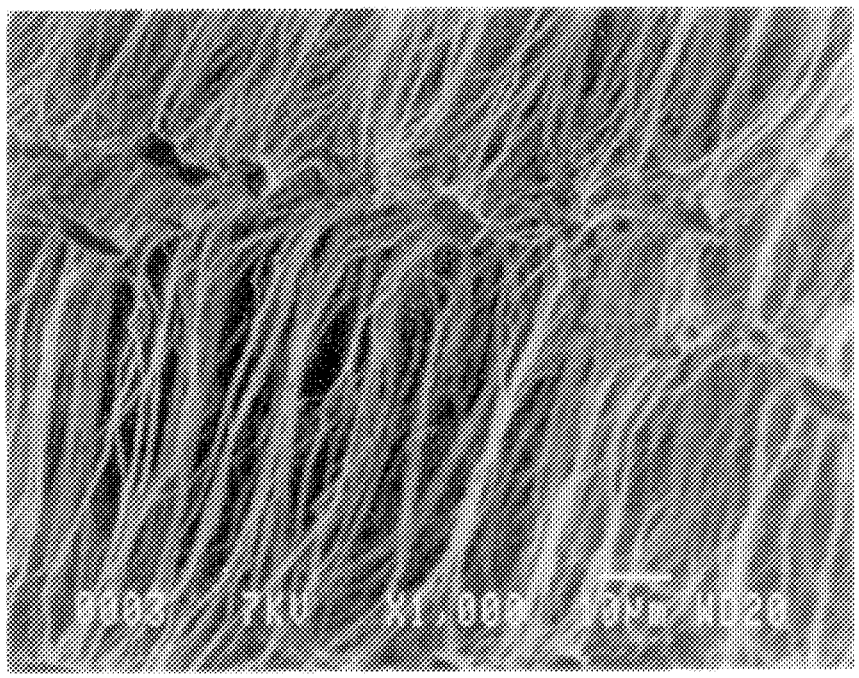
FIG. 20 is a SEM image showing the node-fibril infrastructure of an ePTFE matrix used in another embodiment of the present invention.

The fine dispersion was poured into an impregnation bath. A expanded polytetrafluoroethylene web having the node fibril structure of FIGS. 19 and 20, and the following properties:

| Frazier | 20.55 |
|---|---|
| Coverage | 9 g/m$^2$ |
| Ball Burst | 3.2 lbs. |
| Thickness | 6.5 mil. |
| Mean Flow Pore Size | 9.0 microns |

The Frazier number relates to the air permeability of the material being assayed. Air permeability is measured by clamping the web in a gasketed fixture which is provided in circular area of approximately 6 square inches for air flow measurement. The upstream side was connected to a flow meter in line with a source of dry compressed air. The downstream side of the sample fixture was open to the atmosphere. Testing is accomplished by applying a pressure of 0.5 inches of water to the upstream side of the sample and recording the flow rate of the air passing through the in-line flowmeter (a ball-float rotameter that was connected to a flow meter.

The Ball Burst Strength is a test that measures the relative strength of samples by determining the maximum at break. The web is challenged with a 1 inch diameter ball while being clamped between two plates. The Chatillon, Force Gauge Ball/Burst Test was used. The media is placed taut in the measuring device and pressure affixed by raising the web into contact with the ball of the burst probe. Pressure at break is recorded.

The web described above was passed through a constantly agitated impregnation bath at a speed at or about 3 ft./min, so as to insure uniformity. The impregnated web is immediately passed through a heated oven to remove all or nearly all the solvent, and is collected on a roll.

Several plies of this prepeg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.0085 (10 GHz).

The physical properties of the particulate filler used in Example 4 and Example 7 are compared below.

| Property | Tatsumori (ADMATECHS) | Harbison Walker |
|---|---|---|
| Manufacture Technique | Vapor Metal Combustion | Amorphous Fused Silica |
| Designation | Silica SO-E2 | HW-11-89 |
| Median Particle Size | 0.5 micron | 5 micron |
| Shape | Spherical | Irregular, jagged |
| Surface Area | 6–10 m$^2$/g | 10 m$^2$/g |
| Bulk Density | 0.47 g/cc | 1.12 g/cc |
| Specific Density | 2.26 g/cc | 2.16 g/cc |

EXAMPLE 6

An ePTFE matrix containing an impregnated adhesive filler mixture, based on $SiO_2$ prepared from the vapor combustion of molten silicon is prepared as follows. Two precursor mixtures were initially prepared. One being in the form of a slurry containing a silane treated silica similar to that of Example 5 and the other an uncatalyzed blend of the resin and other components.

Mixture I

The silica slurry is a 50/50 blend of the SO-E2 silica of Example 5 in MEK, where the silica contains a coated of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Mixture II

The desired resin blend product is an MEK based mixture containing an uncatalyzed resin blend (the adhesive) contains approximately 60% solids, where the solid portion is an exact mixture of 41.2% PT-30 cyanated phenolic resin, 39.5% RSL 1462 epoxy resin, 16.7% BC58 flame retardant, 1.5% Irganox 1010 stabilizer, and 1% bisphenol A co-catalyst, all percentages by weight.

Into a ten gallon container, 14.8 pounds of PT-30 and 15–20 pounds of MEK were added and stirred vigorously to completely solvate the PT-30. Then 6 pounds of BC58 were measured and added to the MEK/PT-30 solution and vigorously agitated to solvate the BC58. The stabilizer, 244.5 grams of Irganox 1010 and bisphenol A, 163 grams were added. The ten gallon container was reweighed and 14.22 pounds of RSL 1462 were added. Additional MEK was added to bring the mixture weight to 60 pounds. The contents were then vigorously agitated for approximately 1 to 2 hours, or as long is necessary to completely dissolve the solid components.

The desired product is a mixture of the silica treated with a silane, the uncatalyzed resin blend, and MEK in which 68% by weight of the solids are silica, and the total solids are between 5% and 50% by weight of the mixture. The exact solids concentration varies from run to run, and depends in part on the membrane to be impregnated. The catalyst level is 10 ppm relative to the sum of the PT-30 and RSL1462.

The solid contents of mixtures I and II were determined to verify the accuracy of the precursors and compensate for any solvent flash that had occurred. Then mixture I was added to a ten gallon container to provide 12 pounds of solids, e.g., 515 solids content, 23.48 pounds of mixture I. Then mixture II was added to the container to provide 5.64 pounds of solids, e.g., 59.6% solids, 9.46 pounds of mixture II. the manganese catalyst solution (0.6% in mineral spirits), 3.45 grams, was added to the mixture of mixture I and mixture II and blended thoroughly to form a high solids content mixture.

The bath mixture for impregnating an ePTFE matrix, 28% solids mixture, was prepared by adding sufficient MEK to the high solids content mixture to a total weight of 63 pounds.

Thereafter, an ePTFE matrix was impregnated with this bath mixture to form a dielectric material.

EXAMPLE 7

A fine dispersion was prepared by mixing 26.8 grams Furnace Black (Special Schwarz 100, Degussa Corp., Ridgefield Park, N.J.) and 79 grams of coupling agent (Dynaslan GLYMO CAS #2530-83-8; 3-glycidyloxypropyl-trimethoxysilane (Petrach Systems). The dispersion was subjected to ultrasonic agitation for 1 minute, then added to a stirring dispersion of 17.5 pounds $SiO_2$ (SO-E2) in 17.5 pounds MEK which had previously been ultrasonically agitated. The final dispersion was heated with constant overhead mixing for 1 hour at reflux, then allowed to cool to room temperature.

Separately, an adhesive varnish was prepared by adding the following: 3413 grams of a 57.5% (w/w) mixture of Primaset PT-30 in MEK, 2456 grams of a 76.8% (w/w) mixture of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mu HEX-CEM (OMG Ltd.) in mineral spirits, and 2.40 kg MEK.

In a separate container, 3739 grams of the dispersion described above was added, along with 0.0233 grams of Furnace Black (Special Schwarz 100, Degussa Corp., Ridgefield Park, N.J.), 1328 of the adhesive varnish described above and 38.3 pounds MEK. This mixture was poured into an impregnation bath, and an ePTFE web was passed through the impregnation bath at a speed at or about 3 ft/min. This dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperatures of 200° C. for 90 minutes then cooled under pressure. This resulting dielectric displayed good adhesion to copper.

EXAMPLE 8

An adhesive varnish was prepared by adding the following: 3413 grams of a 57.5% (w/w) solution of Primaset PT-30 (PMN P-88-1591)) in MEK, 2456 grams of a 76.8% (w/w) solution of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mn HEX-CEM in mineral spirits, and 2.40 kg MEK.

In a separate container, 1328 grams of the adhesive varnish described above, 42.3 pounds MEK, 6.40 grams of Furnace Black (Special Schwarz 100, Degussa Corp., Ridgefield, N.J.) and 1860.9 grams $SiO_2$ (SO-E2). This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperature of 220° C. for 90 minutes then cooled under pressure. This resulting dielectric displayed good adhesion to copper.

Although the invention has been described in conjunction with specific embodiments, it is evident that many alternatives and variations will be apparent to those skilled in the art in light of the foregoing description and annexed drawings. Accordingly, the invention is intended to embrace all of the alternatives and variations that fall within the spirit and scope of the appended claims.

What is claimed is:

1. A laminated substrate adapted for mounting a semiconductor device comprising:

a plurality of dielectric and conductive layers including a core layer, said plurality of dielectric layers, conductive layers and core layer arranged in alternatingly disposed, vertically stacked dielectric and conductive layers about a plane of symmetry passing through the core layer, wherein the conductive layers and the core layer are made of copper and the dielectric layers are comprised at least in part of an expanded polytetrafluoroethylene (ePTFE), wherein the dielectric layers include first and second dielectric layers disposed respectively on opposite sides of the core layer, and the first and second dielectric layers are made of the same material, and have approximately the same thickness and the same thickness tolerance, wherein outer-most layers of the stack are conductive layers having substantially the same thickness, and the thickness of the outer-most conductive layers are thicker than any other conductive layers except for the core layer, wherein an amount of said dielectric layers have a higher elastic modulus relative to said other dielectric layers, wherein at least some of said dielectric layers having said higher elastic modulus are arranged outwardly, from said horizontal plane of symmetry, relative to said other dielectric layers such that the flexural modulus of said laminated substrate is substantially maximized.

2. A substrate adapted for mounting an integrated circuit chip, the substrate comprising:

a centrally disposed layer of copper material having two sides and a plane of symmetry between said two sides;

two layers of a first dielectric material, said first dielectric being an expanded polytetrafluoroethylene (ePTFE), each of said layers of dielectric material having a first manufacturing thickness tolerance, each of said first dielectric layers being spaced equidistantly from each other and on opposite sides of said plane of symmetry and bearing against a respective side of said centrally disposed layer;

two layers of another dielectric material, said layers of said another dielectric material having a second manufacturing thickness tolerance that is less than the first manufacturing thickness tolerance, the two layers of another dielectric material being spaced equidistantly from each other and from said first dielectric material and on opposite sides of the plane of symmetry;

and two layers of a metallic electrically conductive material having a third manufacturing thickness tolerance that is less than the first and second manufacturing thickness tolerances.

3. The substrate according to claim 2, wherein the two layers of another dielectric further comprise bismaleimide triazine (BT)-epoxy/glass.

4. The substrate according to claim 2, wherein said two layers of metallic electrically conductive material further comprise copper.

* * * * *